(12) United States Patent
Zhu

(10) Patent No.: US 7,616,143 B1
(45) Date of Patent: Nov. 10, 2009

(54) RECONFIGURABLE DELTA SIGMA ANALOG-TO-DIGITAL CONVERTER AND CUSTOMIZED DIGITAL FILTERS WITH EMBEDDED FLASH FPGA AND FLASH MEMORY

(75) Inventor: Limin Zhu, Fremont, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/022,064

(22) Filed: Jan. 29, 2008

(51) Int. Cl.
*H03M 3/00* (2006.01)
(52) U.S. Cl. .................... 341/143; 341/155; 341/141
(58) Field of Classification Search ................. 341/141, 341/143, 155
See application file for complete search history.

(56) References Cited

U.S. PATENT DOCUMENTS

| 5,416,409 | A  | * | 5/1995  | Hunter       | 324/158.1 |
| 6,956,517 | B1 | * | 10/2005 | Baker et al. | 341/155   |
| 7,126,515 | B1 | * | 10/2006 | Kris         | 341/141   |

\* cited by examiner

*Primary Examiner*—Jean B Jeanglaude
(74) *Attorney, Agent, or Firm*—Lewis and Roca LLP

(57) ABSTRACT

An integrated circuit includes at least one analog input. A sample/hold circuit is coupled to the at least one analog input. A reconfigurable delta-sigma ADC is coupled to the sample/hold circuit. A field programmable gate array is coupled to the reconfigurable delta-sigma ADC. A configurable on-chip clock source is coupled to the reconfigurable delta-sigma ADC providing control and reprogrammable oversampling ratio.

16 Claims, 4 Drawing Sheets

RECONFIGURABLE DELTA SIGMA ANALOG-TO-DIGITAL CONVERTER AND CUSTOMIZED DIGITAL FILTERS WITH EMBEDDED FLASH FPGA AND FLASH MEMORY

BACKGROUND OF THE INVENTION

1. Field of the Invention

The present invention relates to mixed-signal programmable integrated circuits. More particularly, the present invention relates to a reconfigurable delta sigma analog-to-digital converter and customized digital filters with embedded flash FPGA and flash memory 2. The Prior Art During the design stage of mixed-signal system, engineers have to understand and predict what kind of analog input signals the system will interface to, and select appropriate analog-to-digital converters. After the analog signals are converted into the digital domain, designers need to use filters for separation of signals that have been combined and restoration of signals that have been distorted during conversion. According to the particular application, system designers have to decide which filters to employ in order to achieve dedicated signal time-domain and frequency-domain characteristic requirements. Choosing the right analog-to-digital converters and filters for a particular application is a challenge that demands high-level mixed-signal design skills and a significant amount of board level design and testing trial and error.

Some companies begin to design devices using field programmable analog arrays such as an FPAA product offered by Anadigm of Oak Park, Calif. In order to achieve reprogrammability of the analog circuitry, the FPAA architecture is built on the switching fabric of a CMOS-based switched-capacitor (SC) network. The core of the device is an array of identical Configurable Analog Blocks (CABs). The FPAA device consists of a matrix of configurable switched-capacitor configurable analog blocks (CABs), enmeshed in a fabric of programmable interconnect resources. These programmable features are directed by an on-chip SRAM configuration memory. The CABs have access to a single Look-Up Table (LUT), which can be used to implement non-linear functions such as user-defined input-to-output transfer functions, and arbitrary signal waveform generation. In addition, some FPAA devices allow designers to implement an integrated 8-bit analog-to-digital converter. This method basically results in configurable but low-end analog functional blocks such as comparators, filters and SAR ADCs.

Traditionally, in order to process different analog input signals, a designer has to choose multiple ADCs/filters and design them into one system. For example, for test equipment like digital oscilloscopes or sensor signal conditioning detectors, the test device has to equipped with multiple signal conditioning boards, since the analog input signal is unknown until the input is connected and measured. Each board has its own data acquisition components such as ADCs and filters to be installed in order to satisfy different requirements of the analog input signals to be encountered. Designers have to use numerous of discrete devices to interface to different analog signals. Such a system is shown in FIG. 1.

BRIEF DESCRIPTION OF THE INVENTION

A delta sigma ADC is embedded in an integrated circuit. Its performance parameters including resolution, signal-to-noise ratio, sampling rate and power consumption may be configured and reprogrammed through the use of FPGA logic. The delta sigma ADC of the present invention utilizes uses a single-bit, multiple-order delta-sigma modulator to perform analog-to-digital conversions. The delta-sigma ADC consists of two main blocks, an analog modulator and a digital filter and decimator. The analog modulator consists of difference amplifiers, integrator blocks, a comparator, and a feedback DAC. In operation, the analog signal sample is fed to the difference amplifier along with the output of the feedback DAC. The difference between these two signals is integrated and fed to the comparator. The output of the comparator provides the input to the feedback DAC so the system functions as a negative feedback loop that tries to minimize the difference signal. The delta-sigma modulation converts the input signal into a digital pulse train whose average duty cycle represents the digitized signal information. A single comparator within the modulator quantizes the input signal at a much higher sample rate than the bandwidth of the input.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

In order to achieve high performance ADC implementation, a delta sigma ADC is embedded in an integrated circuit. Its performance parameters may be configured and reprogrammed through the use of FPGA logic, rather than by using configurable analog blocks as the basic cells to fabricate ADCs.

Figure 1:
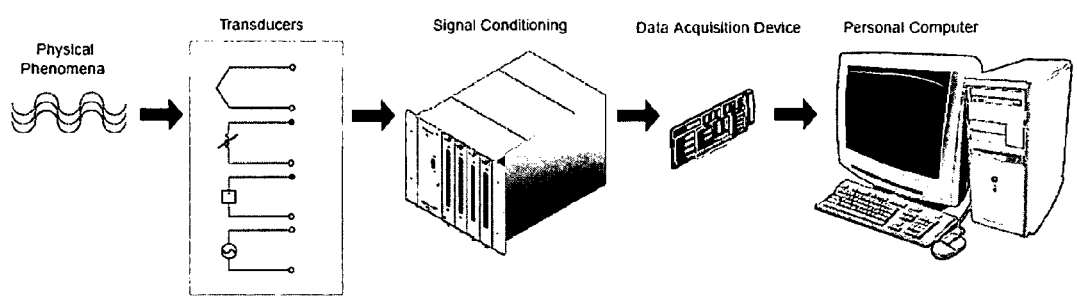
FIG. 1 is a block diagram of a prior-art analog data acquisition and test system.
Figure 2:
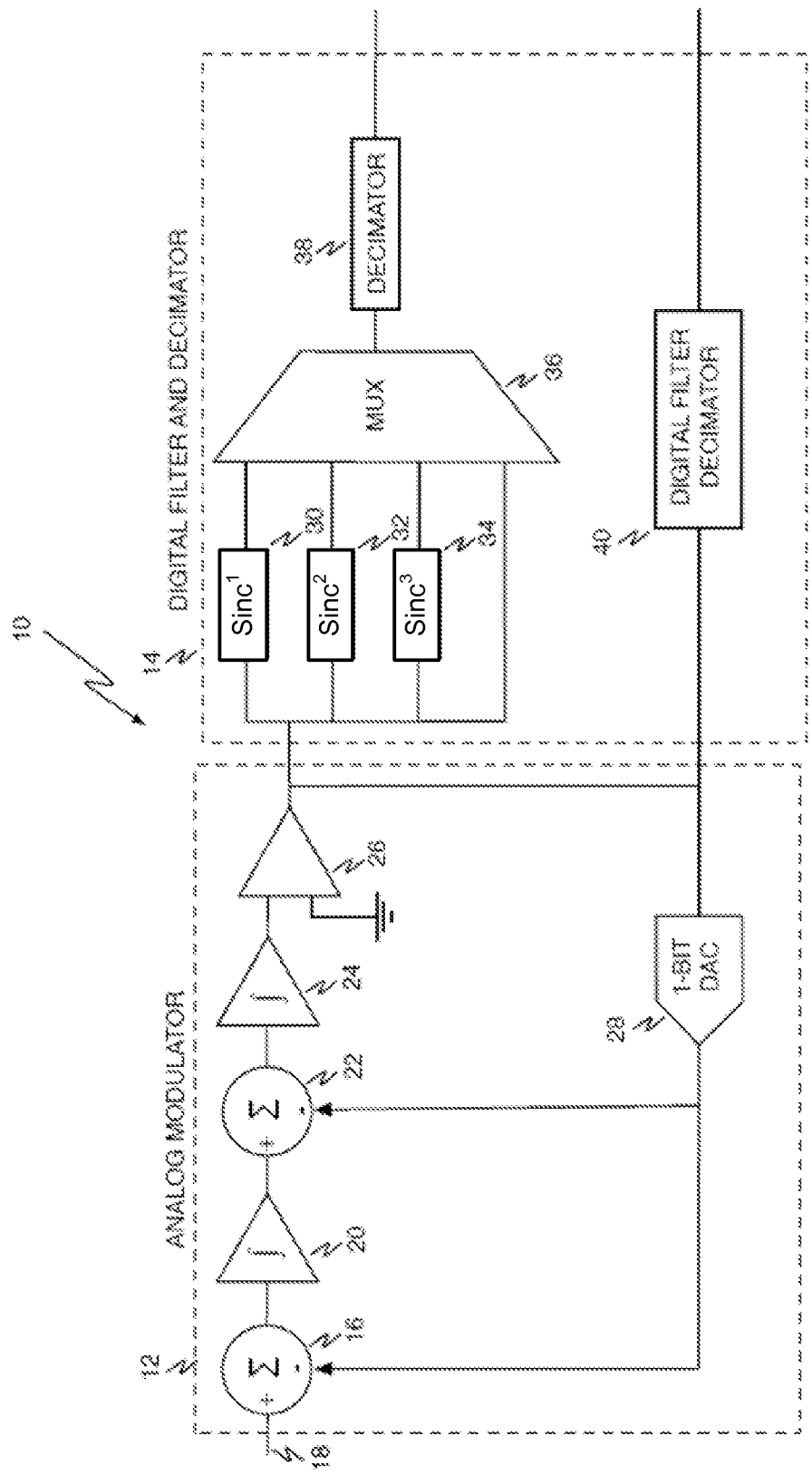
FIG. 2 is a block diagram of a delta-sigma analog-to-digital converter (ADC) in accordance with the present invention.

Referring now to FIG. 2, a block diagram shows block diagram of an illustrative delta-sigma analog-to-digital converter (ADC) 10 in accordance with the present invention. The present invention utilizes uses a single-bit, multiple-order delta-sigma modulator to perform analog-to-digital conversions. The delta-sigma ADC consists of two main blocks, analog modulator 12 and digital filter and decimator 14.

The analog modulator 12 includes a first difference amplifier 16 coupled to an analog signal input node 18. The output of first difference amplifier 16 is integrated by first integrator 20. The output of first integrator 20 is coupled to the input of second difference amplifier 22. The output of second difference amplifier 22 is integrated by second integrator 24. The output of second integrator 24 is presented to comparator 26 to compare its value with ground potential. The output of comparator 26 is presented to 1-bit feedback DAC 28. The output of 1-bit feedback DAC 28 is presented to the subtrahend input of both first and second difference amplifiers 16 and 22.

In operation, the analog signal sample is fed to the first difference amplifier 16 along with the output of the feedback DAC 28. The difference between these two signals is integrated in first integrator 20. The output of the first integrator 20 is fed to the second difference amplifier 22 along with the output of the feedback DAC 28. The output of the second difference amplifier 22 is fed to the comparator. The output of the comparator provides the input to the feedback DAC 28 so the system functions as a negative feedback loop that tries to minimize the difference signal. The delta-sigma modulation converts the input signal into a digital pulse train whose average duty cycle represents the digitized signal information. The single comparator 26 within the modulator quantizes the input signal at a much higher sample rate than the bandwidth of the input.

The output of the delta-sigma modulator 12 feeds directly into the digital filter and decimator 14. The digital filter that processes the 1-bit data stream from the modulator 12 may be selected from among a $Sinc^1$ $(sinx/x)^1$ filter 30, a $Sinc^2$ $(sinx/x)^2$ filter 32, and a $Sinc^3$ $(sinx/x)^3$ filter 34. In addition, there is a digital filter bypass mode. A user can select from between the filters or to bypass the filters for consideration of either low-noise advantage or fast setting time, utilizing multiplexer 36. The select inputs of multiplexer 36 are controlled from an on-chip FPGA core.

Because bandwidth is reduced by the digital filter, in order for the output data rate to satisfy the Nyquist criterion even though it is lower than the original sampling rate, a decimator 38 is coupled to the output of multiplexer 36 to preserve certain input samples and discard the rest as is known in the art.

Figure 3:
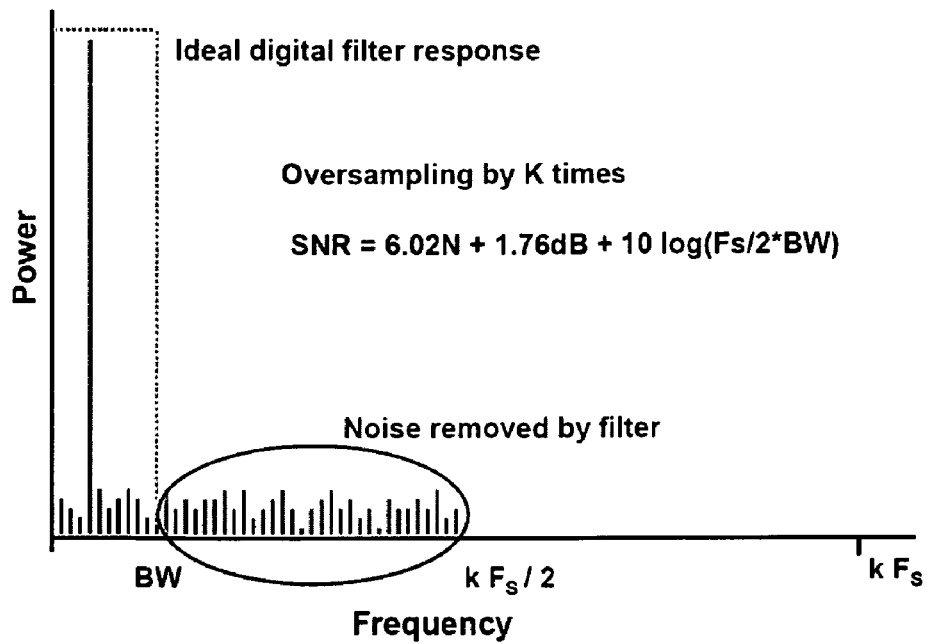
FIGS. 3 and 4 are graphs showing relationships among signal-to-noise ratio (SNR), oversampling ratio, and bandwidth in a delta-sigma digital filter.

There is link between resolution and signal-to-noise ratio (SNR). The SNR and resolution of the delta-sigma ADC is controlled by the oversampling rate of the delta-sigma modulator 12. Considering an N-bit ADC sine wave input, for ideal digital filter response of the delta-sigma ADC when oversampling by K times, the SNR can be calculated as SNR=6.02N+ 1.76 dB+10 log($F_S$/2*BW), where $F_S$ is the regular sampling rate and BW is the bandwidth of the digital filter, as shown in FIG. 3.

Figure 4:
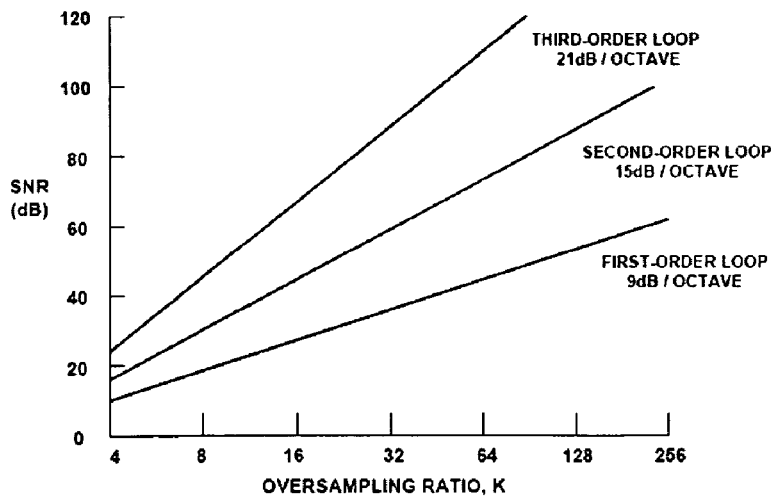

From another point of view, SNR is associated with the oversampling ratio and the order of delta-sigma modulator, as shown in FIG. 4. Because the oversampling ratio can be reprogrammed, it follows that the SNR and corresponding resolution (N-bit) can be changed as well. The oversampling rate of the modulator 12 is set by the frequency ($kf_S$) of the modulator running clock. The delta-sigma ADC clock signals are provided by an on-chip clock system and are controlled by FPGA logic.

The oversampling rate also has an impact on power consumption of analog circuitry. In order to achieve high resolution and SNR, the oversampling ratio K should be kept high, which requires the digital portion of the modulator to run fast and consume more power. This defines the reprogrammability of the delta-sigma ADC SNR, resolution and power consumption.

Figure 5:
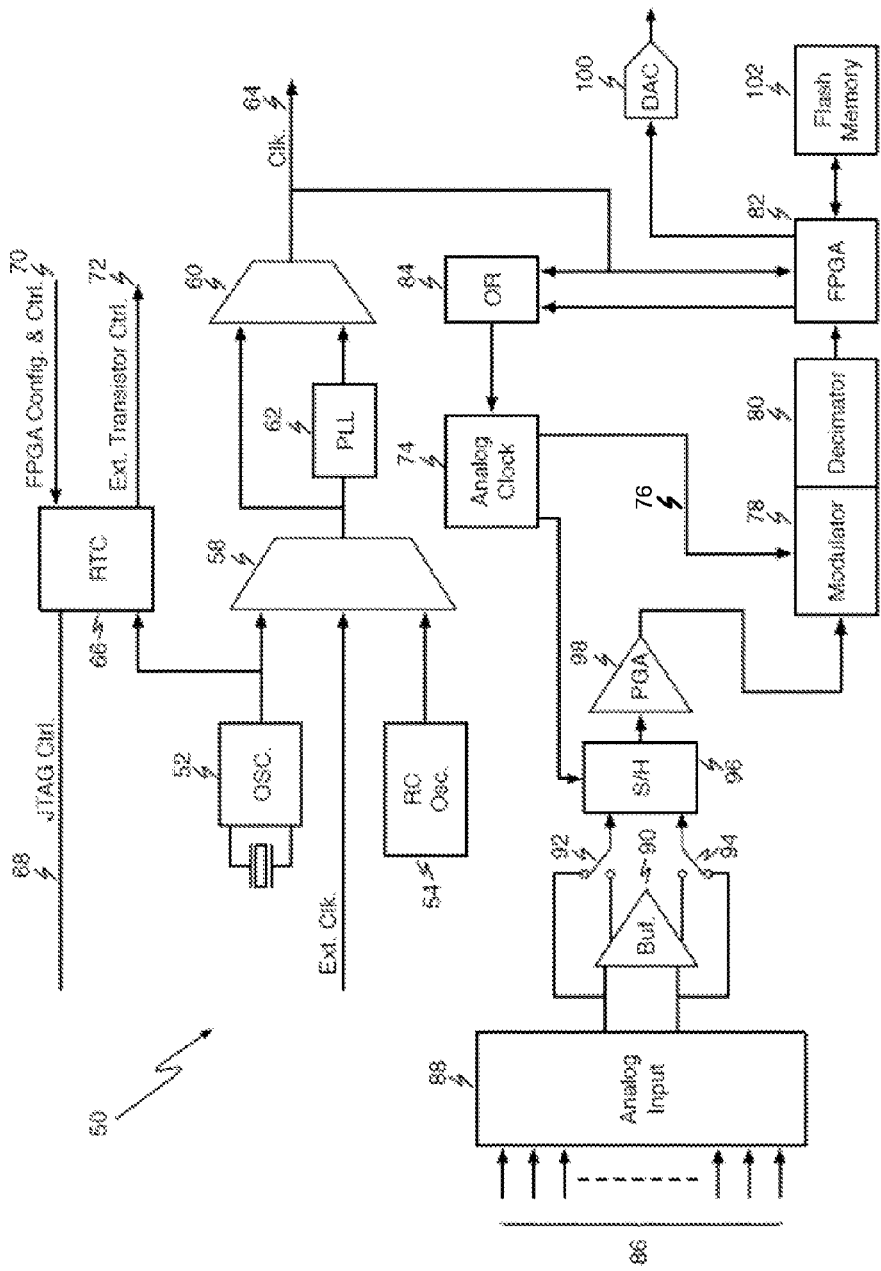
FIG. 5 is a block diagram of an analog peripheral reprogrammable clock source suitable for use in the present invention.

Referring now to FIG. 5, a block diagram shows an illustrative analog peripheral reprogrammable clock source 50 suitable for use in the present invention. Internal crystal oscillator 52, external clock input 54, and internal RC oscillator 56 may be selected via multiplexer 58. The select input of multiplexer 58 may be controlled by the FPGA or by externally-loaded registers.

The output of multiplexer 58 is supplied to one input of multiplexer 60. Multiplexer 60 is employed to select between the output of multiplexer 58 and the output of phase-locked loop (PLL) 62 that is driven by multiplexer 58 and supplied to the other input of multiplexer 60. The output of multiplexer 60 is the clock signal supplied on line 64.

The output of crystal oscillator 52 also drives real-time clock 66. Real-time clock may be configured using JTAG control line 68, or from the FPGA through FPGA configuration and control lines 70. Real-time clock 66 can be used to control external devices via external transistor control lines 72.

By providing integrated oscillators and on-chip PLLs, the present invention provides a high performance programmable PLL clock buffer. The on-chip crystal oscillator 52 or RC oscillator 56 offers flexible clock reference sources with 100 ppm frequency accuracy for driving either internal or external applications. The present invention can source the clocks within the frequency range from about 32 KHz to 100 MHz. The real time clock 66 can be used for applications such as turning the FPGA power supply on and off. The PLL can take either an external clock signal or the RC oscillator signal or the crystal oscillator clock signal as the clock source to offer flexible clock signals for on-chip analog peripherals.

There are three clocks provided for operation of analog peripherals. The first one is an analog clock 74 to provide analog signal sampling frequency $f_{sample}$. Frequency selection for the analog clock 74 is guided by the analog input signal frequency and Shannon's Law. The second one is a modulator clock 76 to provide the clock signal $f_{modulator}$ for the reconfigurable delta-sigma ADC modulator 78. As well understood by persons of ordinary skill in the art, the delta-sigma modulation converts the input signal into a digital pulse train whose average duty cycle represents the digitized signal information. A single comparator within the modulator quantizes the input signal at a much higher sample rate than the bandwidth of the input. The frequency $f_{modulator}$ is equal to the oversampling rate multiplied by $f_{sample}$.

The ADC output data rate from decimator 80, which is $f_{data}$, is equal to $f_{modulator}$ divided by decimation ratio. The on-chip FPGA logic 82 can shut off those three analog peripheral clocks to implement analog peripheral power down status. OR gate 84 is shown for this purpose.

The analog signal may be supplied to the reconfigurable delta sigma ADC of the present invention may be selected from among a plurality of analog input signals on analog-input lines 86 using analog multiplexer 88. The output of analog multiplexer 88 is buffered by buffer 90 that can output either single-ended or differential analog signals by configuring switches 92 and 94 via either the FPGA or externally-loadable registers. The output of buffer 90 is sampled by sample/hold circuit 96. The sample rate of sample/hold circuit 96 is controlled by analog clock 74.

A programmable gain amplifier 98 is coupled between the output of the sample/hold circuit 96 and the input of the reconfigurable delta-sigma ADC. In addition, a digital-to-analog converter 100 is coupled to the field-programmable gate array 82. A flash memory 102 is also coupled to the field-programmable gate array 82.

The reconfigurable delta sigma ADC and customized digital filters according to the present invention provide a fundamentally different solution to resolve the issues in prior-art systems. The present invention provides more flexibility, and may be programmed by a user to bypass the built-in digital filtering/decimation stage and connect the modulator output directly to the FPGA. By using FPGA logic, a user can design a digital filter to implement whatever filter characteristics are required for a particular application. This digital filter design can then be programmed into the programmable logic of the FPGA and the relevant signals routed directly to the user-programmed digital filter rather than the built-in digital filter that is not customized for the user application.

With the integration of the delta-sigma ADC and a flash FPGA, a user can reconfigure the resolution, signal-to-noise ratio, sampling rate and power consumption of the ADC by using reprogrammable control logic implemented in the flash FPGA. The integrated delta-sigma ADC and digital filter FPGA-reconfigurable solution and on-chip clock source provides control and a reprogrammable oversampling ratio. One chip can offer multiple, field reprogrammable analog characteristics suitable for different analog inputs. In addition, the use of customized digital filters implemented on FPGA logic offers a user multiple filtering options.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit comprising:
   at least one analog input;
   a sample/hold circuit coupled to the at least one analog input;
   a reconfigurable delta-sigma ADC coupled to the sample/hold circuit;
   a field programmable gate array coupled to the reconfigurable delta-sigma ADC; and
   a configurable on-chip clock source coupled to the reconfigurable delta-sigma ADC.

2. The integrated circuit of claim 1 wherein the at least one analog input comprises a plurality of analog inputs coupled to an analog multiplexer, an output of the analog multiplexer coupled to the sample/hold circuit.

3. The integrated circuit of claim 2 wherein the output of the analog multiplexer is coupleable to the sample/hold circuit through an analog buffer.

4. The integrated circuit of claim 3 wherein the analog buffer has single-ended outputs and differential outputs.

5. The integrated circuit of claim 4 wherein the single-ended outputs and differential outputs of the analog buffer are selectively coupleable to the sample/hold circuit.

6. The integrated circuit of claim 1 wherein the configurable on-chip clock source comprises:
   a clock-source multiplexer having an output;
   a crystal oscillator coupled to a first input of the clock-source multiplexer;
   a RC oscillator coupled to a second input of the clock-source multiplexer;
   wherein an output of the clock-source multiplexer is coupled to the field programmable gate array, the sample/hold circuit, and the reconfigurable delta-sigma ADC.

7. The integrated circuit of claim 1 further comprising:
   a real-time clock coupled to a crystal oscillator;
   a JTAG control line coupled to the real-time clock;
   at least one external-device control line coupled to the real-time clock; and
   at least one configuration and control line coupled between the real-time clock and the field programmable gate array.

8. The integrated circuit of claim 1 further comprising a phase locked loop selectively coupled to the on-chip clock source.

9. The integrated circuit of claim 1 wherein:
   the on-chip clock source comprises:
   a clock-source multiplexer having an output;
   a crystal oscillator coupled to a first input of the clock-source multiplexer;
   a RC oscillator coupled to a second input of the clock-source multiplexer;
   wherein an output of the clock-source multiplexer is coupled to the field programmable gate array, the sample/hold circuit, and the reconfigurable delta-sigma ADC;
   the integrated circuit further comprising a phase-locked loop selectively coupled to the output of the on-chip clock source.

10. The integrated circuit of claim 9 wherein:
    the integrated circuit further includes a phase-locked loop multiplexer having a first input coupled to the output of the clock-source multiplexer; and
    the phase locked loop is coupled to the output of the clock-source multiplexer and to a second input of the phase-locked loop multiplexer.

11. The integrated circuit of claim 1 wherein the configurable on-chip clock source is coupled to an analog clock source that drives the sample/hold circuit and the reconfigurable delta-sigma ADC.

12. The integrated circuit of claim 11 wherein the analog clock source is selectively enabled by a signal from the field-programmable gate array.

13. The integrated circuit of claim 1 further including a digital-to-analog converter coupled to the field-programmable gate array.

14. The integrated circuit of claim 1, wherein:
    the reconfigurable delta-sigma ADC further comprises:
    a hardwired digital filter; and
    digital filter bypass circuitry to bypass the hardwired digital filter.

15. The integrated circuit of claim 14, wherein:
    the digital filter bypass circuitry is coupled to the field programmable gate array.

16. The integrated circuit of claim 15, wherein:
    the field programmable gate array is programmed to implement a digital filter.

* * * * *